(12) United States Patent
Huang et al.

(10) Patent No.: US 11,499,219 B2
(45) Date of Patent: Nov. 15, 2022

(54) METHOD OF FABRICATING THIN FILM WITH VARYING THICKNESS

(71) Applicant: NATIONAL CHIAO TUNG UNIVERSITY, Hsinchu (TW)

(72) Inventors: Cheng-Sheng Huang, Hsinchu (TW); Chi-Yung Hsieh, Hsinchu (TW); Yu-Chi Lin, Taipei (TW); Chih-Chung Wu, New Taipei (TW); Chi-Fang Huang, Hsinchu County (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 17/094,754

(22) Filed: Nov. 10, 2020

(65) Prior Publication Data
US 2022/0033954 A1 Feb. 3, 2022

(30) Foreign Application Priority Data

Aug. 3, 2020 (TW) .................................. 109126155

(51) Int. Cl.
*C23C 14/04* (2006.01)
*G02B 5/28* (2006.01)

(52) U.S. Cl.
CPC ............ *C23C 14/044* (2013.01); *G02B 5/285* (2013.01)

(58) Field of Classification Search
CPC ........ G02B 5/285; G02B 5/288; C23C 14/044
USPC .......................... 427/162, 166, 167; 359/589
See application file for complete search history.

(56) References Cited

U.S. PATENT DOCUMENTS

| 6,475,557 | B1 * | 11/2002 | Mori ................ B29D 11/00634 |
| | | | 204/192.11 |
| 9,625,628 | B2 | 4/2017 | Hruska et al. |
| 9,804,310 | B2 | 10/2017 | Sprague |
| 10,066,990 | B2 | 9/2018 | Rosen et al. |
| 10,190,910 | B2 | 1/2019 | Hruska et al. |
| 10,502,880 | B2 | 12/2019 | Sprague |

OTHER PUBLICATIONS

Peter Kiesel, Oliver Schmidt, Setu Mohta, Noble Johnson, Stefan Malzer et al., "Compact, low-cost, and high-resolution Interrogation unit for optical sensors," Applied Physics Letters, vol. 89, 201113-1~201113-3, 2006.
Shao-Wei Wang, Xiaoshuang Chen, Wei Lu, Li Wang, Yonggang Wu, and Zhanshan Wang, "Integrated optical filter arrays fabricated by using the combinatorial etching technique", Optics Letters vol. 31, Issue 3, pp. 332-334 (2006).

(Continued)

*Primary Examiner* — Dah-Wei D. Yuan
*Assistant Examiner* — Nga Leung V Law
(74) *Attorney, Agent, or Firm* — Michael Best & Friedrich LLP

(57) ABSTRACT

A method of fabricating a thin film with a varying thickness includes the steps of providing a shadow mask with an opening, providing a carrier plate, arranging a substrate on the carrier plate, and coating the substrate through the opening whilst rotating the carrier plate relative to the shadow mask. A plurality of zones of the substrates is swept and exposed from arcuate portions of the opening per each turn by a plurality of predetermined exposure times, respectively. The varying thickness of the thin film corresponds to variation of the predetermined exposure times.

11 Claims, 13 Drawing Sheets

(56) References Cited

OTHER PUBLICATIONS

Shaowei Wang et al. "Arrays of Narrow Bandpass Filters Fabricated by Combinatorial Etching Technique", Acta Optica Sinica, vol. 26, No. 5, May 2006.
S.-W. Wang, D. Liu, B Lin, X. Chen, W. Lu,"16 x 1 integrated filter array in the MIR region prepared by using a combinatorial etching technique", Applied Physics B, Mar. 2006, vol. 82, Issue 4, pp. 637-641.
S.-W. Wang, M. Li, C.-S. Xia, H.-Q. Wang, X.-S. Chen, W. Lu,"128 channels of integrated filter array rapidly fabricated by using the combinatorial deposition technique", Applied Physics B, Jul. 2007, vol. 88, Issue 2, pp. 281-284.
Angela Piegari; Anna K. Sytchkova; Jiri Bulir; Bernd Harnisch; Andreas Wuttig, "Thin-film filters for a high resolution miniaturized spectrometer", Proceedings vol. 7101, Advances in Optical Thin Films III; 710113 (2008).
M. Dami; R. De Vidi; G. Aroldi; F. Belli; L. Chicarella; A. Piegari; . . . B. Harnisch, "Ultra compact spectrometer using linear variable filters", Proceedings vol. 10565, International Conference on Space Optics—ICSO 2010; 1056559 (2018).
A. Emadi, H. Wu, S. Grabarnik, G. De Graaf and R.F. Wolffenbuttel,"IC-compatible fabrication of linear variable optical filters for micro-spectrometer", Procedia Chemistry vol. 1, Issue 1, Sep. 2009, pp. 1143-1146.
Hsiang-I Hsu "Compact spectrometer based on a gradient waveguide thickness guided-mode resonance", Department of mechanical engineering, National Chiao Tung University, Nov. 2016.
Senjiang Yu, Yong Ni, Linghui He, Quan-Lin Ye, "Tunable Formation of Ordered Wrinkles in Metal Films with Controlled Thickness Gradients Deposited on Soft Elastic Substrates", ACS Appl. Mater. Interfaces 2015,7,95160-5167.
Linyong Qian, Dawei Zhang, Chunxian Tao, Ruijin Hong, and Songlin Zhuang, "Tunable guided-mode resonant filter with wedged waveguide layer fabricated by masked ion beam etching", Optics Letters vol. 41, Issue 5, pp. 982-985 (2016).
D. Hunkel, M. Marso, R. Butz, R. Arens-Fischer, H. Lüth, "Integrated photometer with porous silicon interference filters", Materials Science and Engineering: B, vols. 69-70, Jan. 14, 2000, pp. 100-103.
Laëtitia Abel-Tibérini, Frédéric Lemarquis, Michel Lequime, "Masking mechanisms applied to thin-film coatings for the manufacturing of linear variable filters for two-dimentional array detectors", Applied Optics vol. 47, Issue 30, pp. 5706-5714 (2008).

* cited by examiner

METHOD OF FABRICATING THIN FILM WITH VARYING THICKNESS

CROSS-REFERENCE TO RELATED APPLICATION

This application claims priority of Taiwanese Invention Patent Application No. 109126155, filed on Aug. 3, 2020.

FIELD

The disclosure relates to a method of fabricating a thin film, more particularly to a method of fabricating a thin film with a varying thickness.

BACKGROUND

U.S. Pat. No. 9,804,310 B2 discloses a conventional method of manufacturing a one-dimensionally varying optical filter. In the conventional method, during coating of a film with varying thickness on a substrate, a shadow mask wafer having a one-dimensional array of wedge-shaped openings along a direction of reciprocation is arranged to reciprocate respective to the substrate in the direction of reciprocation. However, a device for driving reciprocating movement of the shadow mask wafer relative to the substrate might be relatively complicated (see FIG. 1 of the US reference). In addition, when a plurality of films are coated on the substrate through a plurality of the shadow mask wafers (see FIGS. 4 and 5 of the US reference), those films may not have the same gradient due to uneven distribution of a coating material in a coating chamber.

Peter Kiesel et al., in an article entitled "Compact, low-cost, and high-resolution interrogation unit for optical sensors," APPLIED PHYSICS LETTERS 89, p 201113-1 to p 201113-3 (2006) discloses that a coating with varying thickness may be formed by utilizing uneven distribution of a coating material in a coating chamber. However, the coating has a gradient that is hard to control, and thus, the coating is not suitable for mass production.

S.-W. Wang et al., in an article entitled "16×1 integrated filter array in the MIR region prepared by using a combinatorial etching technique," Appl. Phys. B 82, p 637-p 641 (2006) discloses a film with a varying thickness made using a plurality of photolithography processes and a plurality of etching processes. However, the method for making the film is relatively complicated and the cost for making the film is relatively high.

S.-W. Wang et al., in an article entitled "128 channels of integrated filter array rapidly fabricated by using the combinatorial deposition technique," Appl. Phys. B 88, 281-284 (2007) discloses a film with a varying thickness made using a plurality of shadow masks in a plurality of deposition processes. Similarly, the method for making the film is relatively complicated and the cost for making the film is relatively high.

Hence, there is a need to provide a method for mass production of a thin film with a varying thickness in a cost-effective way.

SUMMARY

An object of the disclosure is to provide a novel method of fabricating a thin film with a varying thickness, which is relatively simple and low cost for mass production.

According to the disclosure, a method of fabricating a thin film with a varying thickness includes the steps of:

a) providing a shadow mask defining at least one radial line to a central point thereof, and having at least one opening, the opening defining a plurality of arcuate portions which extend respectively about the central point, and which are displaced from each other along the radial line;

b) providing a carrier plate which defines a rotation axis extending in an axial direction through the central point, and which is spaced apart from the shadow mask in the axial direction;

c) arranging on the carrier plate, at least one substrate which defines a first line to permit the first line to align with the radial line in the axial direction, the substrate having a plurality of first zones displaced from each other along the first line;

d) after step c), rotating the carrier plate relative to the shadow mask about the rotation axis to permit the first zones of the substrate to be swept and exposed from the arcuate portions of the opening per each turn by a plurality of predetermined exposure times, respectively; and e) coating a material on the substrate through the opening of the shadow mask whilst implementing step d) to form on the substrate, a first thin film with a varying thickness along the first line corresponding to variation of the predetermined exposure times.

By virtue of the method of the disclosure, which includes steps of arranging the first line of the substrate with the radial line of the shadow mask in the axial direction, and rotating the carrier plate relative to the shadow mask, the varying thickness of the first thin film along the first line corresponds to the variation of the predetermined exposure times. Therefore, a gradient of the first thin film may be easily controlled and the method of the disclosure is suitable for mass production of the first thin film.

BRIEF DESCRIPTION OF THE DRAWINGS

Other features and advantages of the disclosure will become apparent in the following detailed description of the embodiment(s) with reference to the accompanying drawings, in which.

DETAILED DESCRIPTION

Figure 1:
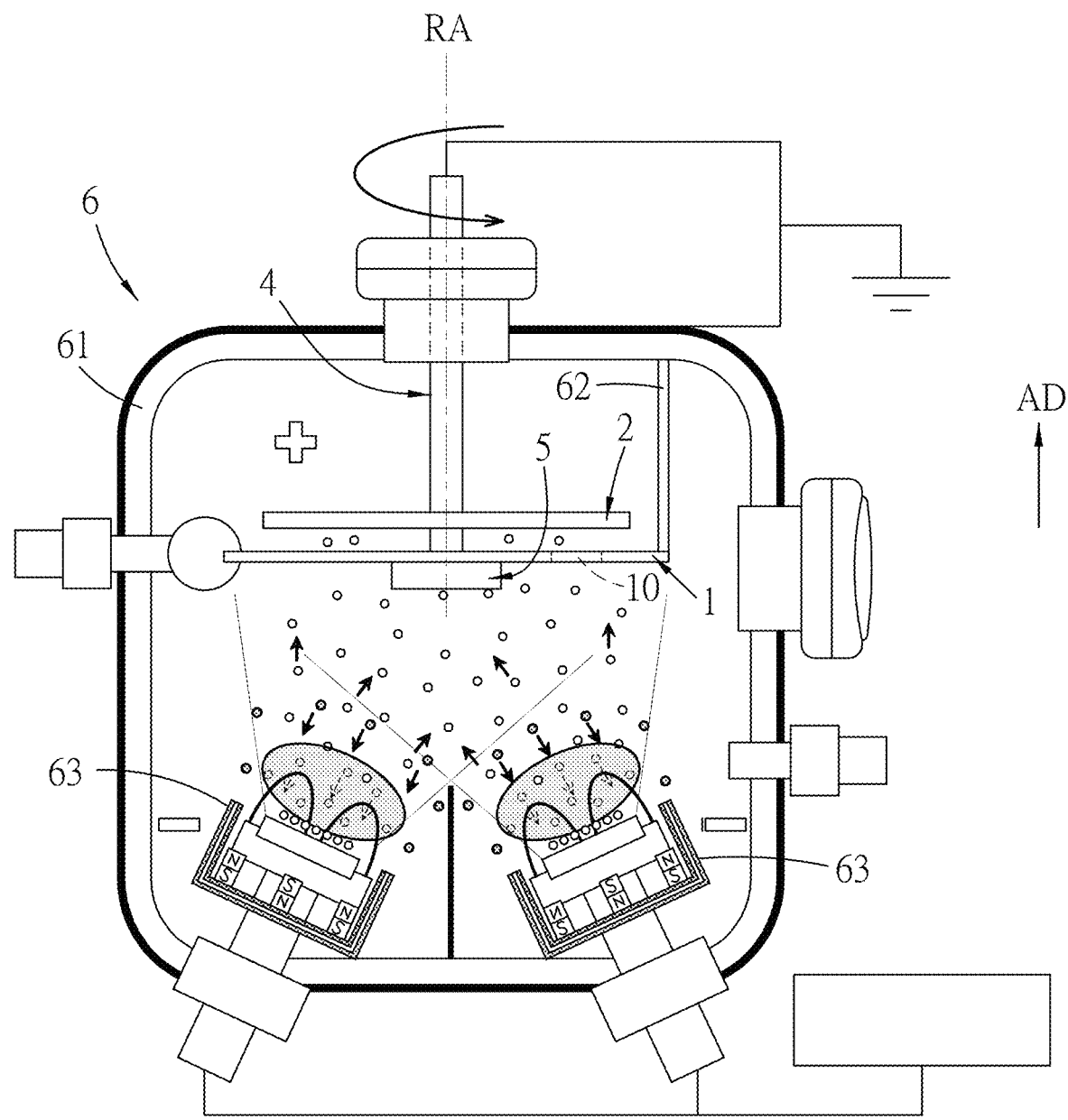
FIG. 1 is a schematic view illustrating a device used for coating a thin film with a varying thickness.

Before the disclosure is described in greater detail, it should be noted that where considered appropriate, reference numerals have been repeated among the figures to indicate corresponding or analogous elements, which may optionally have similar characteristics.

A method of fabricating a thin film with a varying thickness according to a first embodiment of the disclosure includes steps a) to e). The method of the disclosure may be used for forming an optical filter.

Figure 2:
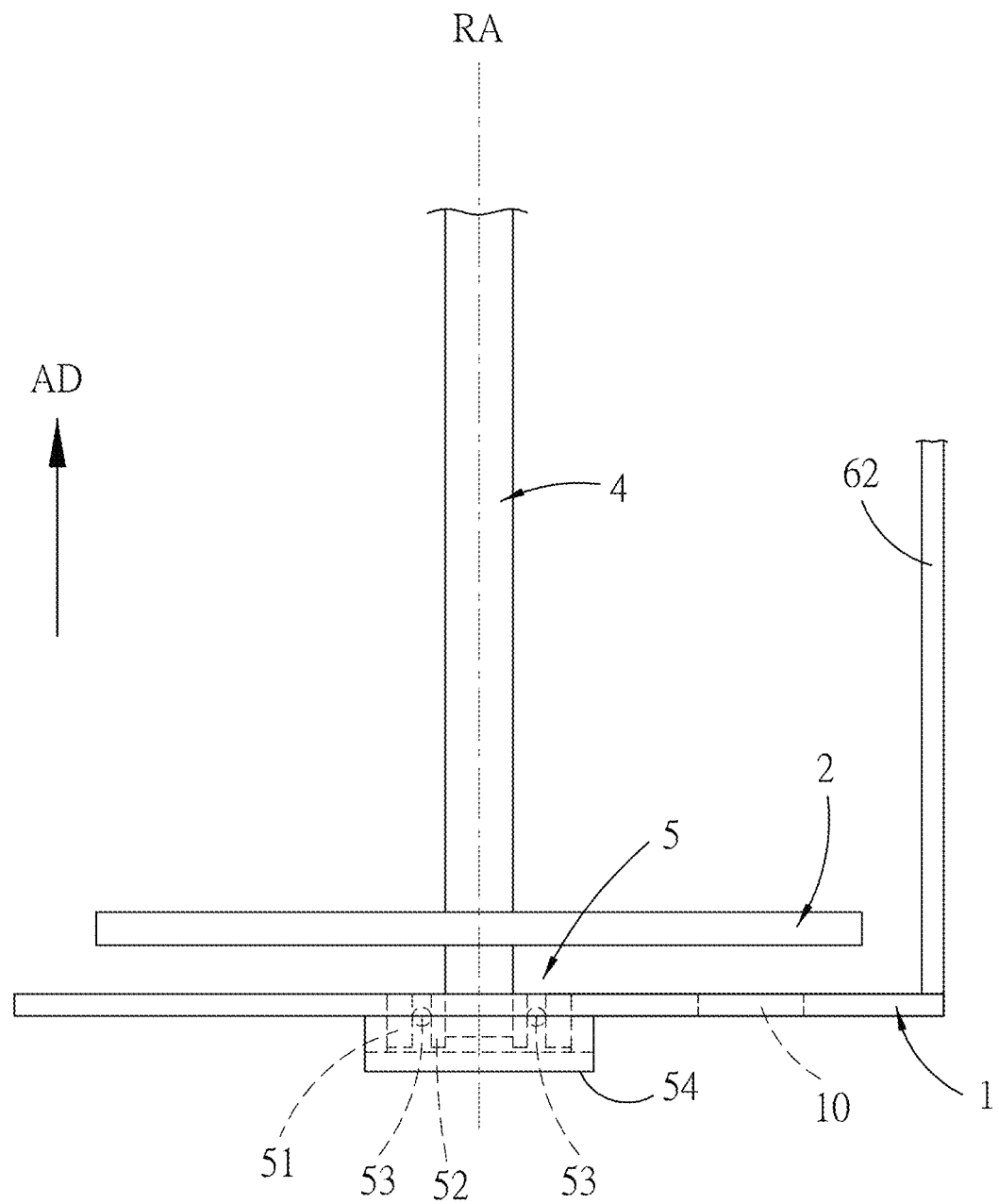
FIG. 2 is a fragmentary enlarged schematic view of FIG. 1, illustrating a bearing unit positioned between a shadow mask and a carrier plate.
Figure 3:
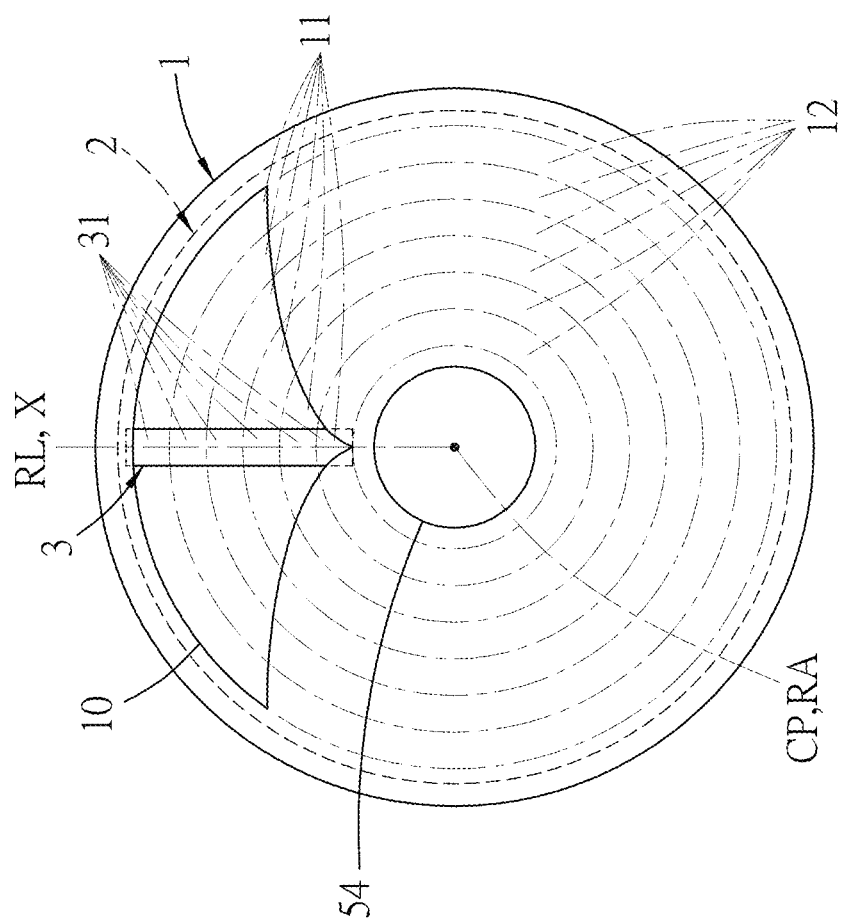
FIG. 3 is a bottom schematic view illustrating arrangement of a shadow mask, a carrier plate, and a substrate in a method of fabricating a thin film with a varying thickness according to a first embodiment of the disclosure.

In step a), a shadow mask 1 as shown in FIGS. 1 to 3 is provided. The shadow mask 1 defines a radial line (RL) to a central point (CP) thereof, and has an opening 10 defining a plurality of arcuate portions 11 which extend respectively about the central point (CP), and which are displaced from each other along the radial line (RL).

In step b), a carrier plate 2 as shown in FIGS. 1 to 3 is provided. The carrier plate 2 defines a rotation axis (RA) extending in an axial direction (AD) through the central point (CP) of the shadow mask 1, and is spaced apart from the shadow mask 1 in the axial direction (AD).

In step c), a substrate 3 is arranged on the carrier plate 2 (see FIG. 3). The substrate 3 defines a first line (X) to permit the first line (X) to align with the radial line (RL) in the axial direction (AD). The substrate 3 has a plurality of first zones 31 displaced from each other along the first line (X).

Step d) is implemented after step c). In step d), the carrier plate 2 is rotated relative to the shadow mask 1 about the rotation axis (RA) to permit the first zones 31 of the substrate 3 to be swept and exposed from the arcuate portions 11 of the opening 10 per each turn by a plurality of predetermined exposure times, respectively.

In step e), a material is coated on the substrate 3 through the opening 10 of the shadow mask 1 whilst implementing step d) to form on the substrate 3, a first thin film (not shown) with a varying thickness along the first line (X) corresponding to variation of the predetermined exposure times. The thus obtained first thin film may be used in an optical filter.

In an embodiment as shown in FIG. 3, the opening 10 may have a geometric shape symmetrical to the radial line (RL).

In an embodiment as shown in FIG. 3, the shadow mask 1 may include a plurality of concentric portions 12 about the central point (CP), and each of the arcuate portions 11 of the opening 10 occupies a respective one of the concentric portions 12 by an occupied ratio.

In an embodiment as shown in FIG. 3, the occupied ratios of the arcuate portions 11, from outer to inner, are gradually varied such that the predetermined exposure times of the first zones 31, from outer to inner, are gradually varied to thereby permit the first thin film obtained in step e) to have a gradually varied thickness along the first line (X).

In an embodiment as shown in FIG. 3, the first thin film obtained in step e) may have, from outer to inner, a gradually reduced thickness along the first line (X).

In an embodiment, the method may further include, before step d), steps d1) and d2).

In step d1), a drive axle 4 shown in FIGS. 1 and 2 is provided. The drive axle 4 extends along the rotation axis (RA) to permit the carrier plate 2 to be mounted on and to rotate with the drive axle 4.

In step d2), a bearing unit 5 shown in FIGS. 1 and 2 is provided. The bearing unit 5 is disposed on a major surface of the shadow mask 1 distal from the carrier plate 2, and includes an outer race 51, an inner race 52, and a plurality of antifriction members 53. The outer race 51 is fixed to the shadow mask 1 in a position apart from the opening 10. The inner race 52 is disposed inwardly of the outer race 51, and is configured to permit the drive axle 4, which extends through the shadow mask 1, to be mounted to rotate with the inner race 52. The antifriction members 53 are sealed between the outer and inner races 51, 53 to permit the inner race 52 to rotate relative to the outer race 51 to thereby allow the carrier plate 2 to rotate relative to the shadow mask 1 in step d). Each of the antifriction members 53 may be in a form of a ball.

In an embodiment shown in FIG. 2, the bearing unit 5 may further include an end cap 54 configured to permit the outer race 51 to be immovably fitted therein so as to prevent the outer race 51, the inner race 52, and the antifriction members 53 from being coated in step e).

In an embodiment shown in FIGS. 1 to 2, the drive axle 4 may be turnably mounted inside a stainless vacuum chamber 61 of a coating device 6. The shadow mask 1 may be immovably mounted inside the vacuum chamber 61 through a fixing frame 62 so as to be disposed between the carrier plate 2 and a coater unit including two coating material sources 63. The substrate 3 is disposed on the carrier plate 2 and located between the carrier plate 2 and the shadow mask 1. The coating device 6 may be a sputtering device, an evaporation device, or the like.

Figure 4:
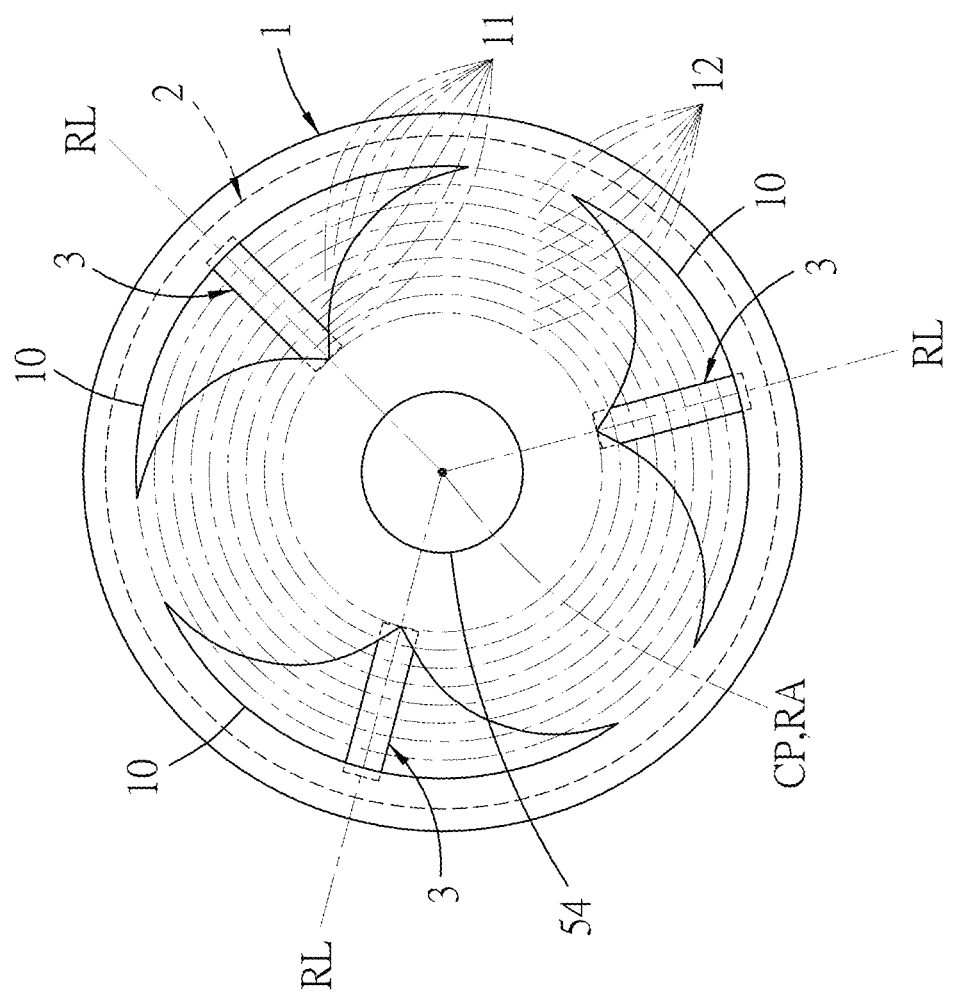
FIG. 4 is a view similar to FIG. 3, but illustrating arrangement of a plurality of substrates relative to the shadow mask in a method of fabricating a thin film with a varying thickness according to a second embodiment of the disclosure.

FIG. 4 mainly illustrates arrangement of a plurality of the substrates 3 relative to the shadow mask 1 in step c) of a method of fabricating a thin film with a varying thickness according to a second embodiment of the disclosure. The second embodiment is similar to the first embodiment, except that the shadow mask 1 provided in step a) of the second embodiment defines a plurality of the radial line (RL) which are displaced from each other in a circumferential direction about the rotation axis (RA), and has a plurality of the openings 10. The arcuate portions 11 of each of the openings 10 are displaced from each other along a respective one of the radial lines (RL).

In an embodiment, in step c), the substrates 3 (shown in FIG. 4) are arranged on the carrier plate 2 to be displaced from each other in a circumferential direction about the rotation axis (RA) such that in step d), the first lines (X) of the substrates 3 are sequentially in line with the radial line (RL) in the axial direction (AD) (see also FIGS. 1 and 2).

By using the shadow mask 1 shown in FIG. 4, first films (not shown) formed respectively on the substrates 3 may have substantially the same predetermined thickness gradient, and for example, may have, from outer to inner, a gradually reduced thickness along the first line (X).

Therefore, the method of the disclosure is used for producing a plurality of thin films having substantially the same thickness gradient in a single batch.

Figure 5:
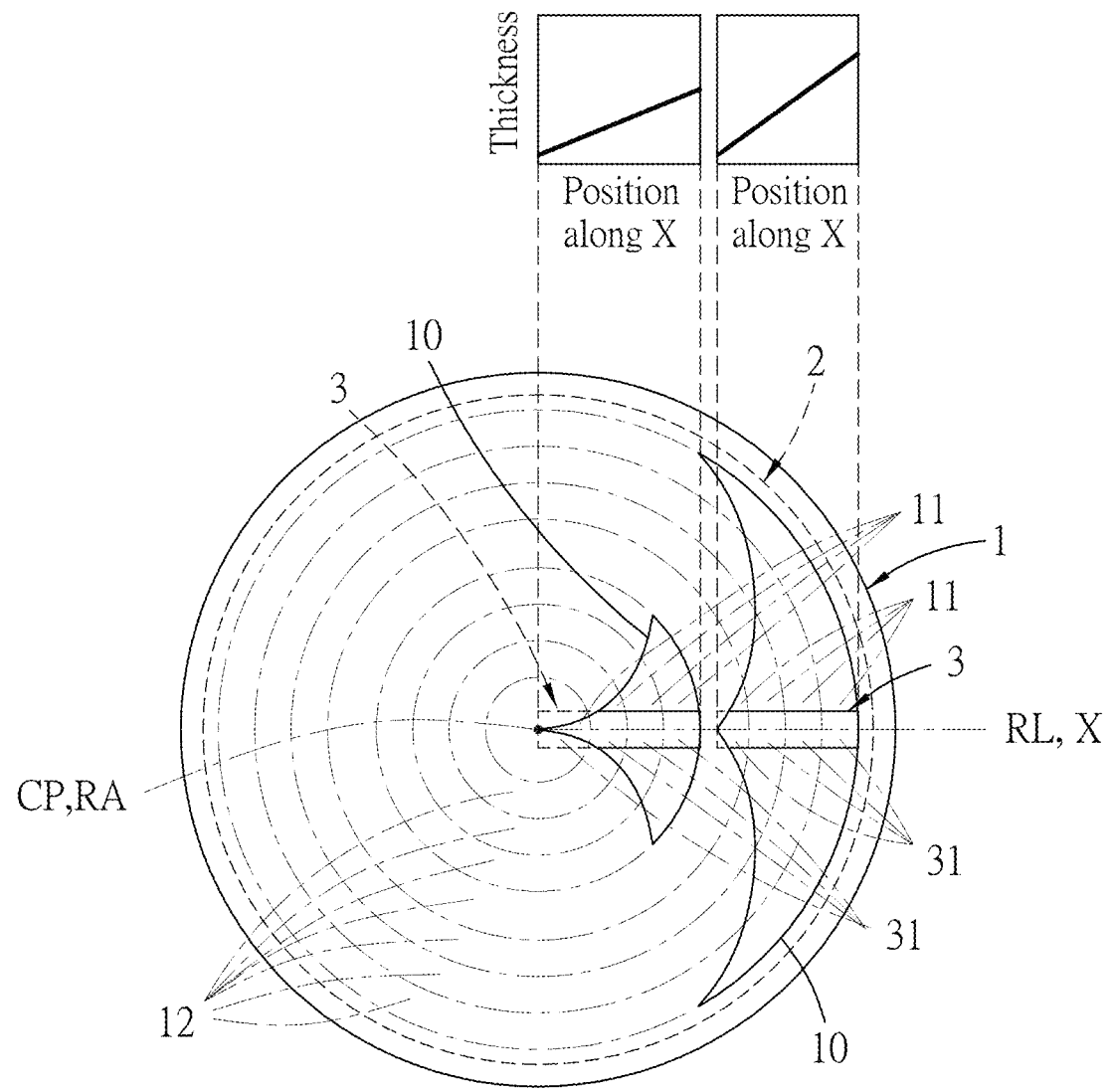
FIG. 5 is another view similar to FIG. 3, but illustrating arrangement of two of the substrates relative to the shadow mask in a method of fabricating a thin film with a varying thickness according to a third embodiment of the disclosure and also illustrating thickness gradients of first thin films obtained by the method.

FIG. 5 mainly illustrates arrangement of two of the substrates 3 relative to the shadow mask 1 in step c) of a method of fabricating a thin film with a varying thickness according to a third embodiment of the disclosure. The third embodiment is similar to the first embodiment, except that the shadow mask 1 provided in step a) of the third embodiment may have two of the openings 10 which are spaced apart from each other along the radial line (RL), and the arcuate portions 11 of the two openings 10 are displaced from each other along the radial line (RL). In addition, two of the substrates 3 are carried by the carrier plate 2 to permit the two substrates 3 to be respectively coated through the two openings 10 of the shadow mask 1 in step e).

In an embodiment shown in FIG. 5, the occupied ratios of the arcuate portions 11 of one of the two openings 10 are varied at a different gradient from those of the other one of the openings 10, and thus two first thin films (not shown) obtained respectively on the two substrates 3 may have two predetermined different thickness gradients. As such, by using the shadow mask 1 shown in FIG. 5, the method of the disclosure is useful for producing two thin films with two different predetermined thickness gradients in a single batch.

Please note that although, in FIG. 5, the inner one of the openings 10 has an inner edge very close to the central point (CP) of the shadow mask 1 (i.e., the position where the end cap 54 shown in FIGS. 1 and 2 is located), the inner edge of the openings 10 is actually in a position very close to the end cap 54. FIG. 5 omits the end cap 54 for the purpose of better illustration. In the following figures, the end cap 54 on the shadow mask 1 is also omitted.

Figure 6:
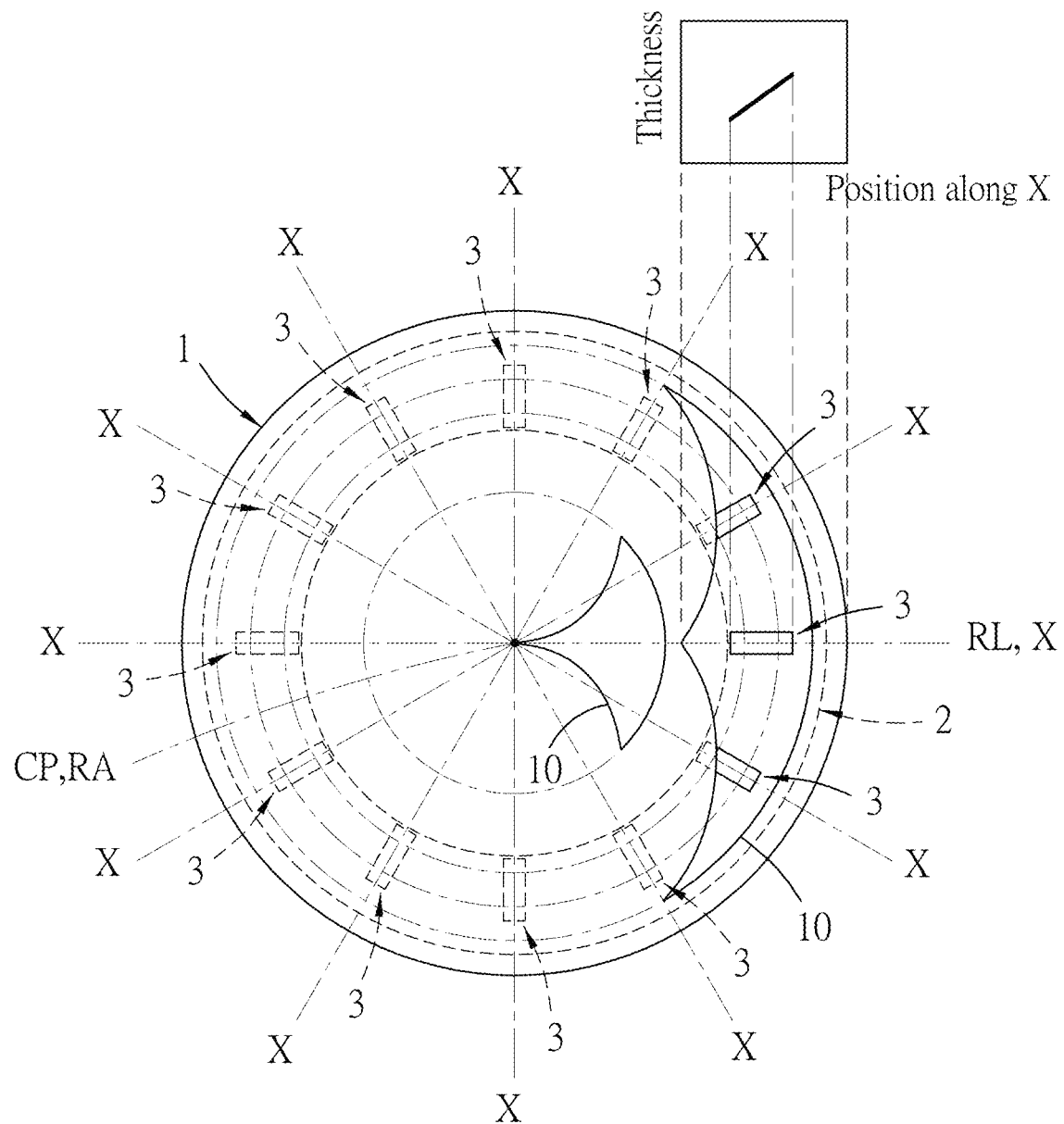
FIG. 6 is a view similar to FIG. 5, but illustrating arrangement of a plurality of the substrates relative to the shadow mask in a method of fabricating a thin film with a varying thickness according to a fourth embodiment of the disclosure.

FIG. 6 mainly illustrates arrangement of a plurality of the substrates 3 relative to the shadow mask 1 in step c) of a method of fabricating a thin film with a varying thickness according to a fourth embodiment of the disclosure. The fourth embodiment is similar to the third embodiment except that in step c) of the fourth embodiment, the substrates 3 (twelve of the substrates 3 are shown in FIG. 6) are arranged on the carrier plate 2 to be displaced from each other in a circumferential direction about the rotation axis (RA), and in steps d) and e), the substrates 3 are only to be swept and exposed from the outer one of the openings 10.

By using the shadow mask 1 shown in FIG. 6, the method of the disclosure is useful for producing twelve thin films with substantially the same predetermined thickness gradient in a single batch.

Figure 7:
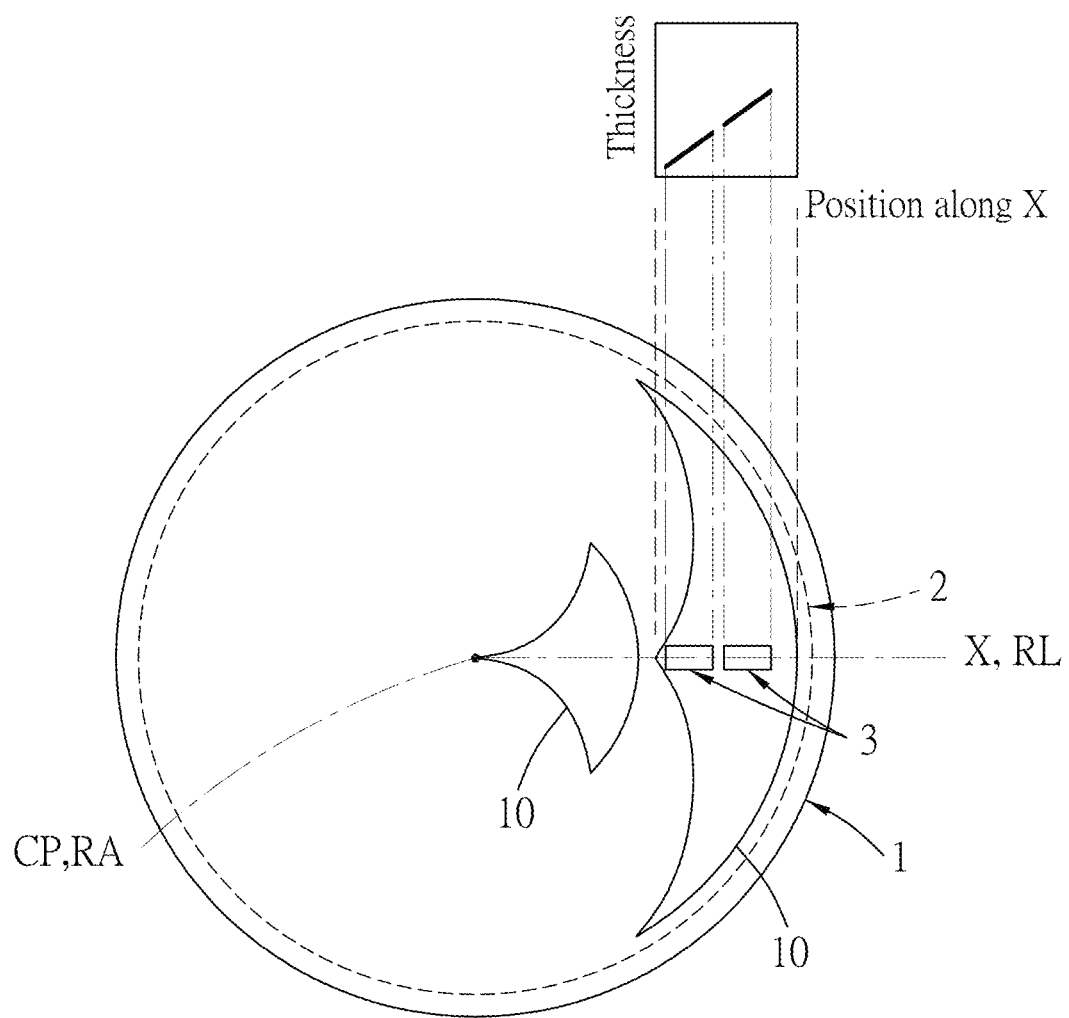
FIG. 7 is another view similar to FIG. 5, but illustrating arrangement of two of the substrates relative to the shadow mask in a method of fabricating a thin film with a varying thickness according to a fifth embodiment of the disclosure.

FIG. 7 mainly illustrates arrangement of two of the substrates 2 relative to the shadow mask 1 in step c) of a method of fabricating a thin film with a varying thickness according to a fifth embodiment of the disclosure. The fifth embodiment is similar to the third embodiment except that in step c) of the fifth embodiment, the two substrates 3 are arranged to permit the two substrates 3 to be coated through the outer one of the openings 10 of the shadow mask 1 in step e).

By using the shadow mask 1 shown in FIG. 7, the method of the disclosure is useful for producing two thin films with different thickness ranges but with substantially the same predetermined thickness gradient in a single batch.

Figure 8:
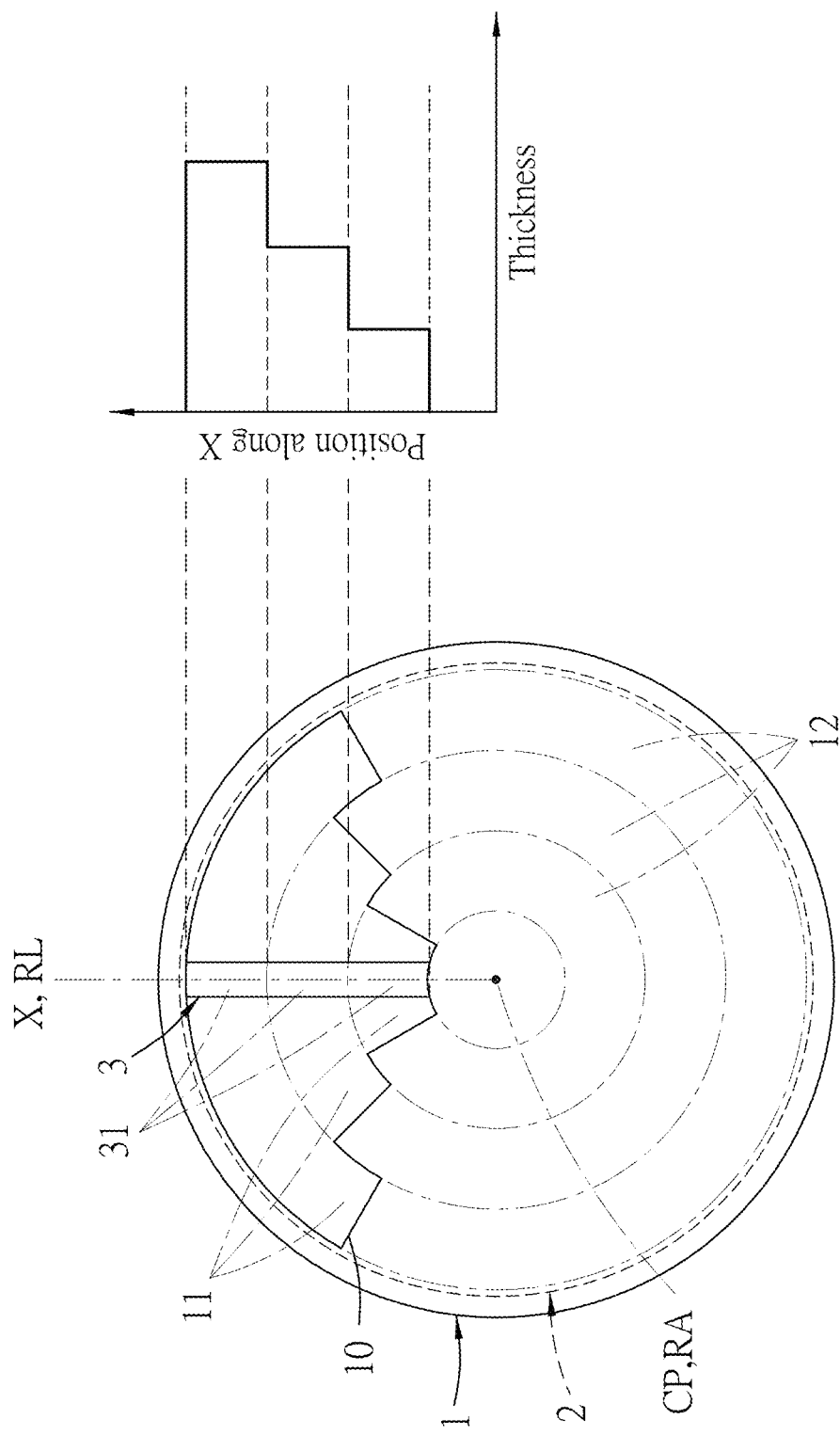
FIG. 8 is yet another view similar to FIG. 3, but illustrating arrangement of the substrate relative to the shadow mask in a method of fabricating a thin film with a varying thickness according to a sixth embodiment of the disclosure.

FIG. 8 mainly illustrates arrangement of the substrate 3 relative to the shadow mask 1 in step c) of a method of fabricating a thin film with a varying thickness according to a sixth embodiment of the disclosure. The sixth embodiment is similar to the first embodiment except that in the sixth embodiment, the occupied ratios of the arcuate portions 11 of the shadow mask 1, from outer to inner, are stepwise varied such that the predetermined exposure times of the first zones 31, from outer to inner, are stepwise varied to thereby permit the first thin film obtained in step e) to have a stepwise thickness along the first line (X).

In an embodiment shown in FIG. 8, the first thin film obtained in step e) may have three regions with three different thicknesses.

Figure 9:
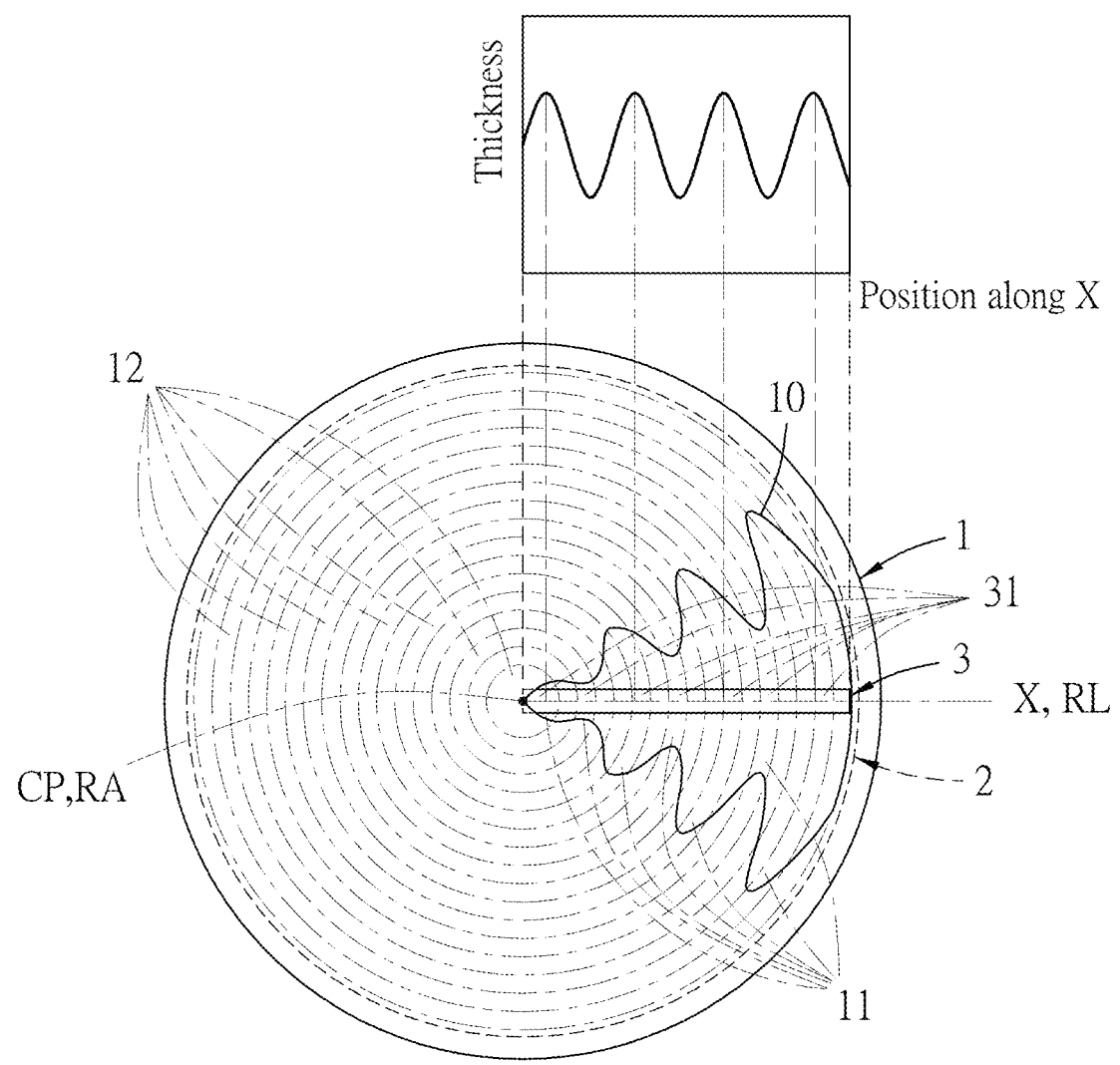
FIG. 9 is yet another view similar to FIG. 3, but illustrating arrangement of the substrate relative to the shadow mask in a method of fabricating a thin film with a varying thickness according to a seventh embodiment of the disclosure.

FIG. 9 mainly illustrates arrangement of the substrate 3 relative to the shadow mask 1 in step c) of a method of fabricating a thin film with a varying thickness according to a seventh embodiment of the disclosure. The seventh embodiment is similar to the first embodiment except that in the seventh embodiment, the occupied ratios of the arcuate portions 11 of the shadow mask 1, from outer to inner, are periodically varied such that the predetermined exposure times of the first zones 31, from outer to inner, are periodically varied to thereby permit the first thin film obtained in step e) to have a periodically varying thickness along the first line (X). In this embodiment, the first thin film may have a one-dimensional periodically varying thickness.

Figure 10:
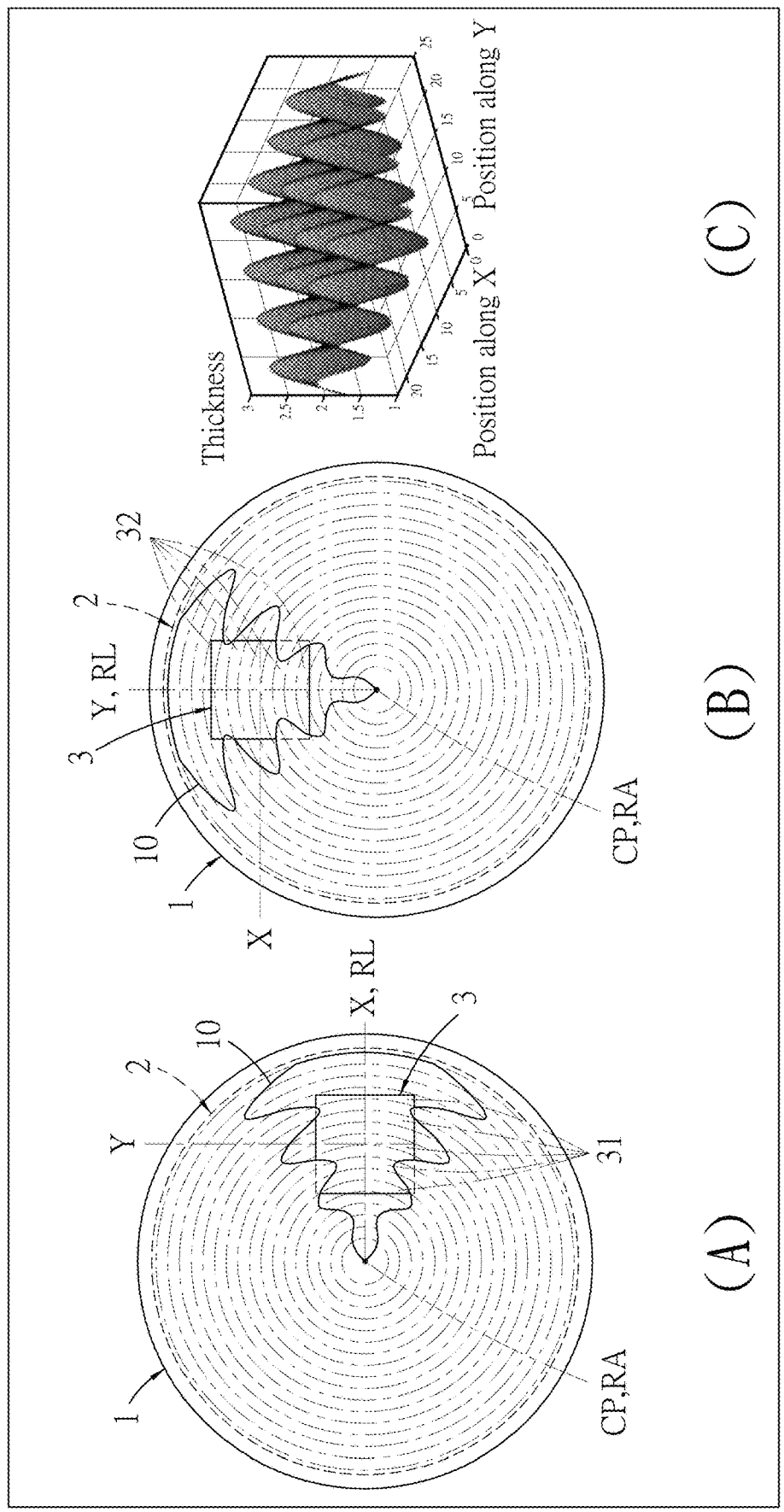
FIG. 10 shows schematic views illustrating two arrangements of the substrate relative to the shadow mask in a method of fabricating a thin film with a varying thickness according to an eighth embodiment of the disclosure, and also illustrating a coated structure obtained by this method.

FIG. 10 mainly illustrates arrangements of the substrate 3 relative to the shadow mask 1 in steps c) and h) of a method of fabricating a thin film with a varying thickness according to an eighth embodiment of the disclosure. The eighth embodiment is similar to the seventh embodiment expect that, in the eighth embodiment, the substrate 3 further defines a second line (Y) transverse to the first line (X), and has a plurality of second zones 32 displaced from each other along the second line (Y). In addition, the method further includes steps f) to h).

Step f) is implemented after step e). In step f), the substrate 3 is arranged on the carrier plate 2 to permit the second line (Y) to be in line with the radial line (RL) in the axial direction (AD) (see also FIGS. 1 and 2).

Step g) is implemented after step f). In step g), the carrier plate 2 is rotated relative to the shadow mask 1 about the rotation axis (RA) to permit the second zones 32 of the substrate 3 to be swept and exposed from the arcuate portions 11 of the opening 10 per each turn by the plurality of predetermined exposure times, respectively.

In step h), the material is coated on the substrate 3 through the opening 10 of the shadow mask 1 whilst implementing step g) to form on the first thin film, a second thin film (not shown) with a varying thickness along the second line (Y) which correspond to a variation of the predetermined exposure times.

In an embodiment shown in FIG. 10, the first line (X) is perpendicular to the second line (Y). In step c), the substrate 3 is arranged as shown in FIG. 10(A) (i.e., the first line (X) of the substrate 3 aligns with the radial line (RL) in the axial direction (AD) (see FIGS. 1 and 2). After step e), the first thin film with a one-dimensional periodically varying thickness along the first line (X) is obtained. In step f), the substrate 3 is rotated 90 degrees to allow the second line (Y) to be in line with the radial line (RL) (see FIG. 10(B)). After step h), the second thin film with a one-dimensional periodically varying thickness along the second line (Y) is obtained. Combined simulation topography of the first and second thin film is shown in FIG. 10(C) as a two-dimensional periodically varying structure.

Figure 11:
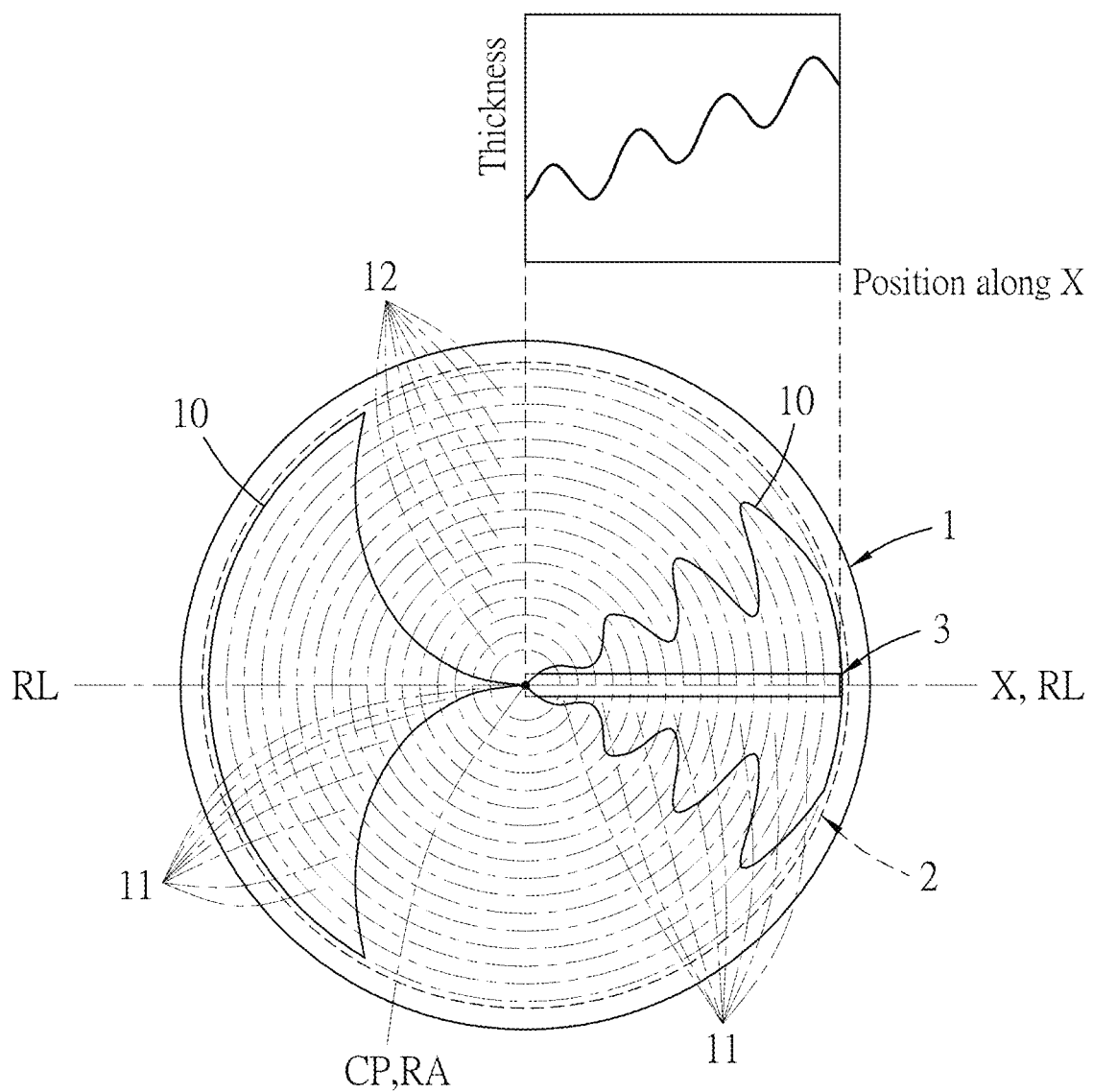
FIG. 11 is still yet another view similar to FIG. 3, but illustrating arrangement of the substrate relative to the shadow mask in a method of fabricating a thin film with a varying thickness according to a ninth embodiment of the disclosure.

FIG. 11 mainly illustrates arrangement of the substrate 3 relative to the shadow mask 1 in step c) of a method of fabricating a thin film with a varying thickness according to a ninth embodiment of the disclosure. In the ninth embodiment, the shadow mask 1 includes two openings 10, one of which has a configuration similar to the opening 10 of the first embodiment, and the other of which has a configuration similar to the opening 10 of the seventh embodiment. Inner edges of the openings 10 are close to the central point (CP) (i.e., close to the end cap 54 shown in FIGS. 1 to 3). As shown in FIG. 11, the thus obtained first thin film may have a thickness profile similar to a combined thickness profile of the first thin films obtained in the first and seventh embodiments.

Figure 12:
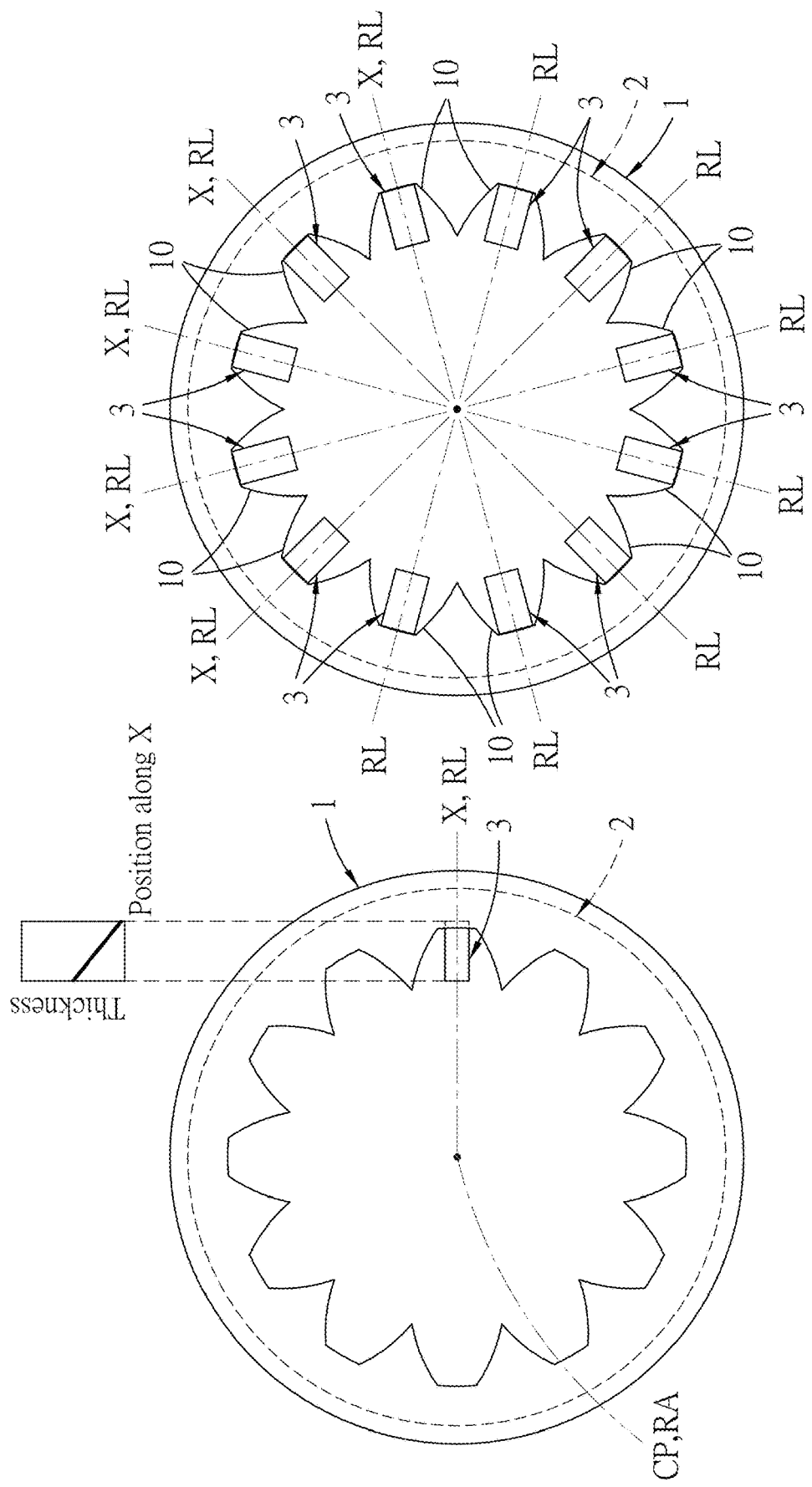
FIG. 12 shows two schematic views illustrating arrangement of the substrates relative to the shadow mask in a method of fabricating a thin film with a varying thickness according to a tenth embodiment of the disclosure.

FIG. 12 mainly illustrates arrangement of the substrates 3 relative to the shadow mask 1 in step c) of a method of fabricating a thin film with a varying thickness according to a tenth embodiment of the disclosure. In the tenth embodiment, the shadow mask 1 provided in step a) may have twelve openings 10, and twelve of the substrates 3 are arranged in step c). The occupied ratios of the arcuate portions 11 (not shown in FIG. 12) of each of the openings 10, from outer to inner, are gradually increased. Therefore, each of the first thin films formed on a respective one of the substrates 3 may have, from outer to inner, a gradually increased thickness along the first line (X).

Figure 13:
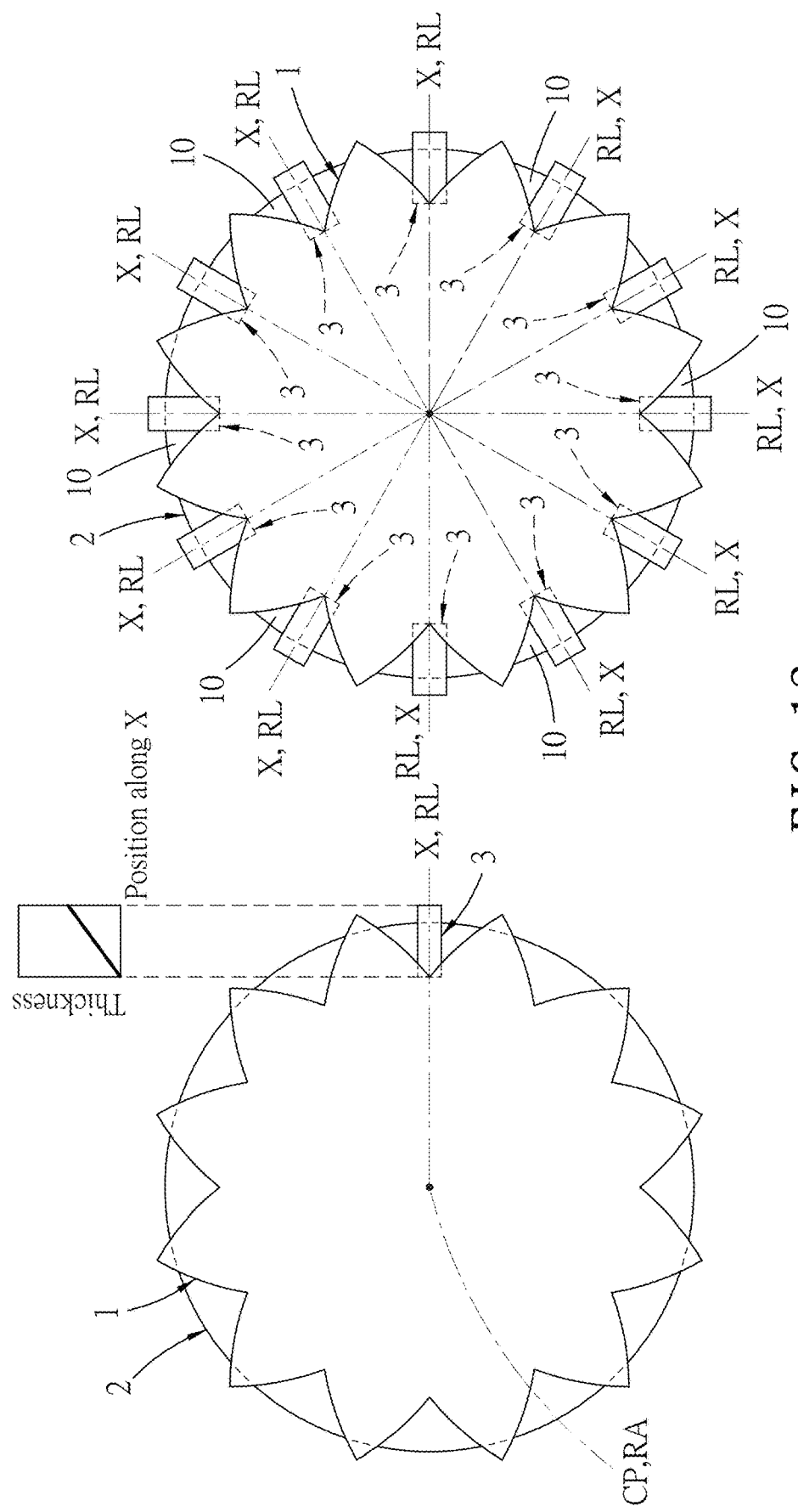
FIG. 13 shows two schematic views illustrating arrangement of the substrates relative to the shadow mask in a method of fabricating a thin film with a varying thickness according to an eleventh embodiment of the disclosure.

FIG. 13 mainly illustrates arrangement of the substrates 3 relative to the shadow mask 1 in step c) of a method of fabricating a thin film with a varying thickness according to an eleventh embodiment of the disclosure. The eleventh embodiment is similar to the tenth embodiment except that in the eleventh embodiment, the occupied ratios of the arcuate portions 11 (not shown in FIG. 13) of each of the openings 10, from outer to inner, are gradually reduced. Therefore, each of the first thin films formed on a respective one of the substrates 3 may have, from outer to inner, a gradually reduced thickness along the first line (X).

In sum, the method of the disclosure, which includes steps of arranging the first line (X) of the substrate 3 with the radial line (RL) of the shadow mask 1 in the axial direction (AD), and rotating the carrier plate 2 relative to the shadow mask 1, the varying thickness of the first thin film along the first line (X) corresponds to the variation of the predetermined exposure times. Therefore, a gradient of the first thin film may be easily controlled, and the method of the disclosure, which is cost-saving and relatively simple, is suitable for mass production as compared to conventional methods for forming a thin film with varying thickness.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment (s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A method of fabricating a thin film with a varying thickness, comprising the steps of:
   a) providing a shadow mask defining at least one radial line to a central point thereof, and having at least one opening, the opening defining a plurality of arcuate portions which extend respectively about the central point, and which are displaced from each other along the radial line;
   b) providing a carrier plate which defines a rotation axis extending in an axial direction through the central point, and which is spaced apart from the shadow mask in the axial direction;
   c) arranging on the carrier plate, at least one substrate which defines a first line to permit the first line to align with the radial line in the axial direction, the substrate having a plurality of first zones displaced from each other along the first line;
   d) after step c), rotating the carrier plate relative to the shadow mask about the rotation axis to permit the first zones of the substrate to be swept and exposed from the arcuate portions of the opening per each turn by a plurality of predetermined exposure times, respectively; and
   e) coating a material on the substrate through the opening of the shadow mask whilst implementing step d) to form on the substrate, a first thin film with a varying thickness along the first line corresponding to variation of the predetermined exposure times,
   wherein the shadow mask includes a plurality of concentric portions about the central point, and each of the arcuate portions of the opening is formed in a respective one of the concentric portions, an occupied ratio of each of the arcuate portions being a ratio of each of the arcuate portions of the opening to the respective one of the concentric portions; and
   wherein the occupied ratios of the arcuate portions, from outer to inner, are varied along the radial line to permit the variation of the predetermined exposure times, such that the first thin film with the varying thickness is formed along the first line.

2. The method according to claim 1, before step d), further comprising steps of:
   d1) providing a drive axle extending along the rotation axis to permit the carrier plate to be mounted on and to rotate with the drive axle; and
   d2) providing a bearing unit which is disposed on a major surface of the shadow mask distal from the carrier plate, and which includes
       an outer race fixed to the shadow mask in a position apart from the opening, an inner race disposed inwardly of the outer race, and configured to permit the drive axle, which extends through the shadow mask, to be mounted to rotate with the inner race, and a plurality of antifriction members sealed between the outer and inner races to permit the inner race to rotate relative to the outer race to allow the carrier plate to rotate relative to the shadow mask in step d).

3. The method according to claim 2, wherein the bearing unit further includes an end cap configured to permit the outer race to be immovably fitted therein so as to prevent the outer race, the inner race, and the antifriction members from being coated in step e).

4. The method according to claim 1, wherein, in step c), a plurality of the substrates are arranged on the carrier plate to be displaced from each other in a circumferential direction about the rotation axis such that in step d), the first lines of the substrates are sequentially in line with the radial line in the axial direction.

5. The method according to claim 1, wherein the shadow mask defines a plurality of the radial lines which are displaced from each other in a circumferential direction about the rotation axis, and has a plurality of the openings, the arcuate portions of each of the openings being displaced from each other along a respective one of the radial lines.

6. The method according to claim 1,
wherein the shadow mask has two of the openings which are spaced apart from each other along the radial line, the arcuate portions of the two openings being displaced from each other along the radial line; and
wherein two of the substrates are carried by the carrier plate to permit the two substrates to be respectively coated through the two openings of the shadow mask in step e).

7. The method according to claim 1, wherein the occupied ratios of the arcuate portions, from outer to inner, are gradually varied such that the predetermined exposure times of the first zones, from outer to inner, are gradually varied to permit the first thin film obtained in step e) to have a gradually varied thickness along the first line.

8. The method according to claim 1, wherein the occupied ratios of the arcuate portions, from outer to inner, are stepwise varied such that the predetermined exposure times of the first zones, from outer to inner, are stepwise varied to permit the first thin film obtained in step e) to have a stepwise thickness along the first line.

9. The method according to claim 1, wherein the occupied ratios of the arcuate portions, from outer to inner, are periodically varied such that the predetermined exposure times of the first zones, from outer to inner, are periodically varied to permit the first thin film obtained in step e) to have a periodically varying thickness along the first line.

10. The method according to claim 1, wherein the substrate further defines a second line transverse to the first line, and has a plurality of second zones displaced from each other along the second line, the method further comprising steps of f) after step e), arranging on the carrier plate, the at least one substrate to permit the second line to be in line with the radial line in the axial direction;

g) after step f), rotating the carrier plate relative to the shadow mask about the rotation axis to permit the second zones of the substrate to be swept and exposed from the arcuate portions of the opening per each turn by the plurality of predetermined exposure times, respectively; and h) coating the material on the substrate through the opening of the shadow mask whilst implementing step g) to form on the first thin film, a second thin film with a varying thickness along the second line corresponding to variation of the predetermined exposure times.

11. The method according to claim 1, wherein the opening has a geometric shape symmetrical to the radial line.

* * * * *